US011687106B1

(12) United States Patent
Samson et al.

(10) Patent No.: US 11,687,106 B1
(45) Date of Patent: Jun. 27, 2023

(54) SYSTEMS AND METHODS FOR ADAPTIVE POWER MULTIPLEXING WITH A FIRST TYPE OF POWER MULTIPLEXER AND A SECOND TYPE OF POWER MULTIPLEXER

(71) Applicant: QUALCOMM Incorporated, San Diego, CA (US)

(72) Inventors: Giby Samson, San Diego, CA (US); Harshat Pant, San Diego, CA (US); Keyurkumar Karsanbhai Kansagra, Bangalore (IN); Mohammed Yousuff Shariff, Hyderabad (IN); Vinayak Nana Mehetre, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/662,460

(22) Filed: May 9, 2022

(51) Int. Cl.
*G05F 1/56* (2006.01)
*G06F 1/26* (2006.01)
*H03K 17/687* (2006.01)

(52) U.S. Cl.
CPC ............... *G05F 1/56* (2013.01); *G06F 1/263* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 8,981,839 B2* | 3/2015 | Kay | ......................... | G06F 1/263 |
| | | | | 307/43 |
| 9,852,859 B2* | 12/2017 | Cao | ..................... | H03K 19/0008 |
| 10,317,968 B2* | 6/2019 | Pant | ......................... | G06F 1/263 |
| 10,539,997 B2* | 1/2020 | Samson | ..................... | G11C 7/22 |
| 10,684,671 B2* | 6/2020 | Sridhar | ..................... | G06F 1/3296 |
| 11,157,066 B2* | 10/2021 | Murphy | ..................... | G06F 1/3296 |
| 2019/0391608 A1* | 12/2019 | Cao | ........................... | G05F 1/59 |

FOREIGN PATENT DOCUMENTS

WO     2022026489      2/2022

* cited by examiner

*Primary Examiner* — Jeffery S Zweizig
(74) *Attorney, Agent, or Firm* — Haynes and Boone, LLP

(57) ABSTRACT

A system on chip (SOC) includes a power distribution network (PDN) that has two different types of power multiplexers. The first power multiplexer type includes a lower resistance switching logic, and the second type includes a higher resistance switching logic as well as digital logic to provide an enable signal to the first type of power multiplexer. A given first-type power multiplexer may have multiple power multiplexers of the second type in a loop, the loop including communication paths for the enable signal and feeding the enable signal back to an enable input of the first-type power multiplexer.

28 Claims, 13 Drawing Sheets

SYSTEMS AND METHODS FOR ADAPTIVE POWER MULTIPLEXING WITH A FIRST TYPE OF POWER MULTIPLEXER AND A SECOND TYPE OF POWER MULTIPLEXER

TECHNICAL FIELD

The present application relates, generally, to power multiplexing and, more specifically, to using a first type of power multiplexer and a second type of power multiplexer to provide adaptive power multiplexing.

BACKGROUND

A conventional computing device (e.g., smart phone, tablet computer, etc.) may include a system on chip (SOC), which has a processor and other operational circuits. The SOC may receive its power from a battery, and thus conventional designs may balance SOC performance and power usage to deliver a desirable experience to the user while requiring as little battery charging as practicable.

Power multiplexing is a technique that may be used to save power in some instances. One way in which some systems may use power multiplexing to save power is to enable a power collapse of some parts of a processing core (using a first power multiplexer and a first power domain) while providing power to other parts of the processing core (using a second power multiplexer and a second power domain). Another way in which some conventional systems may use power multiplexing is to switch from a first power supply to a second power supply to power a central processing unit (CPU) memory and adjusting the second power supply to overdrive the CPU memory. This technique may save power by allowing the SOC to selectively raise a voltage at some components while not raising the voltage at other components.

SUMMARY

Various implementations provide circuits and techniques to use routing space and chip area more efficiently in a power distribution network (PDN). Some implementations may use a first type of power multiplexer (e.g., having higher-resistance switches) and a second type of power multiplexer (e.g., having lower-resistance switches) to distribute power multiplexing functionality within a semiconductor chip. For instance, the first type of power multiplexer may provide enable signals to the second type of power multiplexer, and the second type of power multiplexer may be distributed throughout the chip in a daisy chain or other arrangement. The first type of power multiplexer and the second type of power multiplexer may both be implemented to conserve routing space within the chip, thereby providing a PDN with a smaller impact upon routing and more efficient semiconductor area usage than other implementations.

According to one implementation, a system on chip (SOC) includes: a first power multiplexer of a first type coupled to a first power supply and a second power supply, the first power multiplexer including: first switching logic disposed between the first power supply, the second power supply and a load; and a second power multiplexer of a second type coupled to the first power supply and the second power supply, the second power multiplexer including: second switching logic between the first power supply and the second power supply and the load, the second switching logic including an enable input coupled to the first power multiplexer.

According to one implementation, a method including: sending an enable signal from a first power multiplexer of a first type to a second power multiplexer of a second type; switching a first load from a first power supply to a second power supply by the first power multiplexer and the second power multiplexer, the second power multiplexer switching the first load in response to the enable signal; and receiving the enable signal at the first power multiplexer.

According to one implementation, a semiconductor chip includes: a first power multiplexer of a first type and a second power multiplexer of the first type, the first power multiplexer and the second power multiplexer being arranged in a daisy chain with a controller, the daisy chain passing a control signal from the controller to the first power multiplexer and on to the second power multiplexer and feeding back in the control signal to the controller; a third power multiplexer and a fourth power multiplexer, of a second type, arranged in a first loop from the first power multiplexer, the first loop passing a first enable signal from the first power multiplexer to the third power multiplexer and the fourth power multiplexer and back to the first power multiplexer; and a fifth power multiplexer and a sixth power multiplexer, of the second type, arranged in a second loop from the second power multiplexer, the second loop passing a second enable signal from the second power multiplexer to the fifth power multiplexer and the sixth power multiplexer and back to the second power multiplexer.

According to yet another implementation, power distribution network (PDN) on a semiconductor chip, the PDN includes: first means for multiplexing between a first power supply and a second power supply; second means for multiplexing between the first power supply and the second power supply, wherein the second means is configured to receive an enable signal from the first means, the enable signal causing the second means to select between the first power supply, the second power supply, and power collapse; wherein the first means comprises a first type of power multiplexer, and wherein the second means comprises a second type of power multiplexer different from the first type of power multiplexer, further wherein the second means comprises a plurality of power multiplexers of the second type arranged in a loop to feedback the enable signal to the first means.

DETAILED DESCRIPTION

Figure 1:
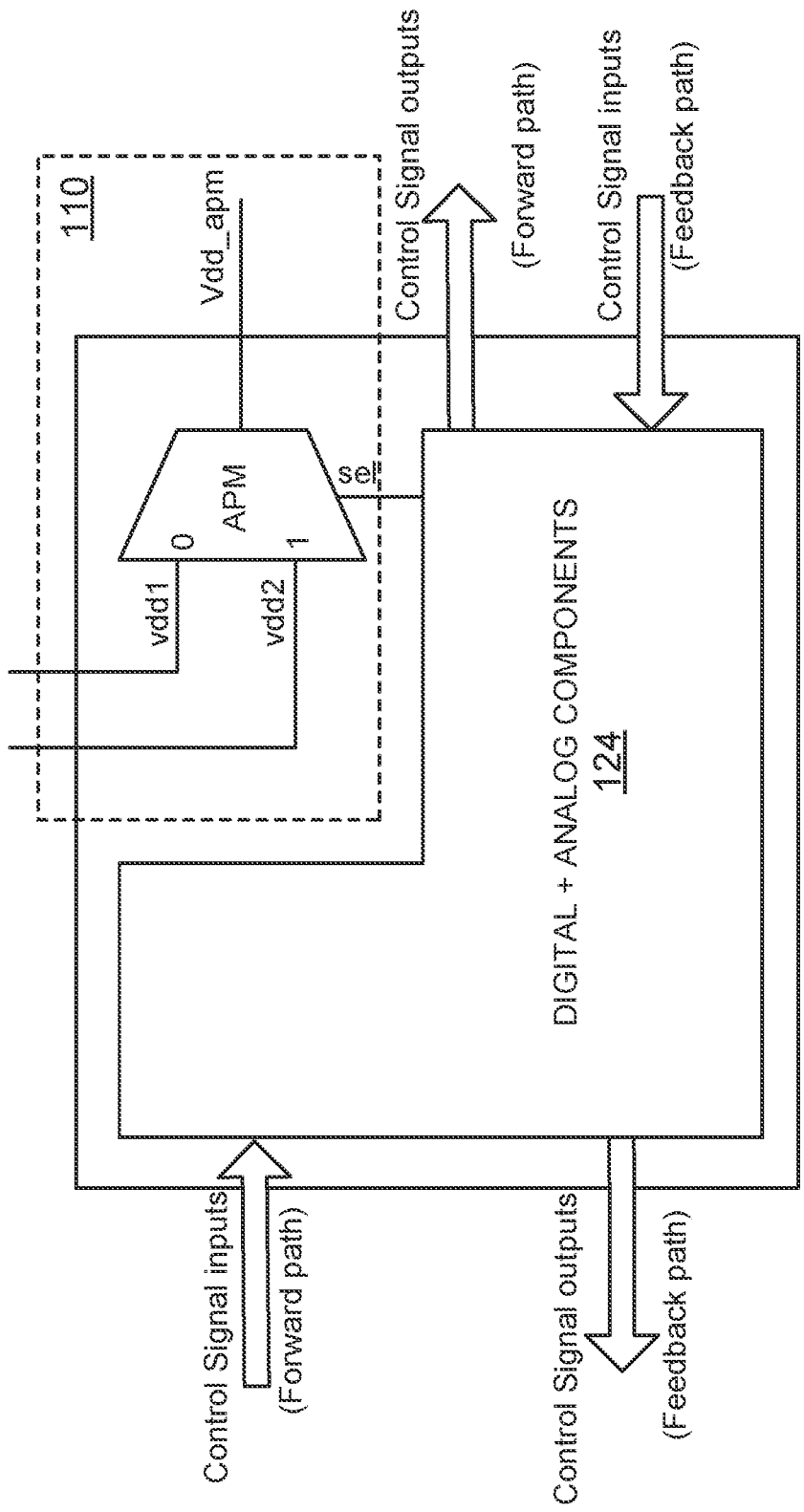
FIG. 1 is a simplified diagram illustrating an example power multiplexer, according to one implementation.

Some power multiplexing architectures may include multiple power multiplexing components, such as higher-resistance switches, lower-resistance switches, enable logic, and the like, into a single power multiplexing circuit. However, those power multiplexing circuits may use an undesirable amount of routing space within a system on chip (SOC) or processing unit. There is a need in the art for a more efficient use of routing space in a power distribution network (PDN).

Various implementations provided herein include systems and methods to provide power multiplexing using a first-type power multiplexer and a second-type power multiplexer. For instance, the first-type power multiplexer may include digital logic, first switching logic disposed between a first power supply, a second power supply and a load. The second-type power multiplexer may be coupled to the first power supply and the second power supply and include second switching logic disposed between the first power supply, second power supply and the load. The second switching logic may include enable inputs that are coupled to the digital logic of the first-type power multiplexer. Thus, in some examples, the first-type power multiplexer may provide control signals for the second-type power multiplexer.

Continuing with the example, the first switching logic may be implemented to have a higher resistance than does the second switching logic. In one example, the first switching logic may be referred to as "few switches", and the second switching logic may be referred to as "rest switches" though those terms are used for convenience rather than to define the switching logic. In one implementation, the first switching logic may be turned on to create a conductive path with higher resistance during a first time period of a voltage switching operation, and the second switching logic may be turned on to create another conductive path with lower resistance as the first switching logic is turned off during a second time period of the voltage switching operation. Therefore, when voltage is switched from one voltage supply to another voltage supply, there may be a time period when higher resistance is applied courtesy of the few switches to avoid an inrush or outrush of current.

As noted above, the first-type power multiplexer may provide an enable signal to the second-type power multiplexer. For instance, the second-type power multiplexer may be arranged with other similar power multiplexers in series with respect to the enable signal so that the enable signal, which originates from the first-type power multiplexer, is transmitted on a conductive path through the second-type power multiplexers and back to an enable input at the first-type power multiplexer. In fact, some implementations may include multiple first-type power multiplexers arranged in a daisy chain (e.g., may be referred to as a "main chain"), and each one of the first-type power multiplexers may have second-type power multiplexers arranged in respective chains (e.g., may be referred to as a "secondary chain").

Each one of the power multiplexers may serve a load. For instance, a block of memory cells may be served by multiple secondary chains. Each power multiplexer within the secondary chains may switch between a first power supply, a second power supply, and power collapse.

Continuing with the example, a power domain of a chip may include a main chain and one or more secondary chains. The chip may include multiple power domains, and a second power domain may include a second main chain with its own one or more secondary chains.

In one example, the transistors of the few switches and the rest switches may be controlled using a switching voltage that is generated to be higher than or equal to the highest voltage of the two different power supplies. The purpose of the switching voltage may be to have a gate source voltage that is greater than or equal to zero during an off period of a transistor to ensure that the transistors are turned off. Voltage generators may be implemented in any appropriate part of the power multiplexer architecture. For instance, voltage generators may be implemented within the first-type power multiplexers, second-type power multiplexers, or may be stand-alone structures. Any appropriate method may be used to supply voltage from the switching voltage generators to the gates of the transistors of the first switching logic and the second switching logic.

The placement of the switching voltage generators may influence an overall architecture of the power distribution network (PDN). For instance, in an example in which the second-type power multiplexers are implemented with the switching voltage generators, that may result in larger structures for the individual second-type power multiplexers, but it may reduce the amount of switching voltage routing. On the other hand, other implementations may include switching voltage generators in some but not all second-type power multiplexers or may use stand-alone switching voltage generators. Such implementations may reduce a size of the second-type power multiplexers (at least the ones without the switching voltage generators) at a cost of increased switching voltage routing.

Various implementations may include advantages over other systems. One advantage may include increased space savings. For instance, the second-type power multiplexers may each include multiple transistors in parallel to provide a desired resistance, where a lower resistance may correspond to a larger number of transistors in parallel. As a result, the second-type power multiplexers (the rest switches) may use on-chip routing resources over multiple metal layers. When paired with the first-type power multiplexers (the few switches), the resulting structure may use an undesirably large number of metal layers within the chip structure.

Various implementations of the present disclosure move the rest switches into their own multiplexing structures and outside of the structures that include the few switches. As a result, fewer routing resources and fewer metal layers may be used, even though the number of transistors may be the same. Put another way, moving the rest switches away from the few switches may reduce routing crowding so that a fewer number of metal layers may be used for the routing. In one example, an implementation of the present disclosure may use six total metal layers, whereas a structure having both few switches and rest switches may use nine or more metal layers. Of course, the scope of implementations is not limited to any number of metal layers, and this comparison is given for ease of illustration. Furthermore, reduction of routing crowding may allow for other components to be moved closer to the power multiplexers within a chip design, thereby allowing for more efficient use of semiconductor area.

FIG. 1 is a conceptual diagram of one example of adaptive power multiplexing circuitry, according to one implementation. FIG. 1 shows simplified blocks to illustrate the power multiplexer 110 and enable logic circuitry block 124. The enable logic circuitry block 124 includes a forward path, which may communicate with power management software, such as within an operating system kernel running on a processor core of an SOC. The forward path may include signals from the power management software that instruct the enable logic circuitry block 124 to select one or the other power supplies Vdd1, Vdd2. A switching signal "sel" is provided from the enable logic circuitry block 124 to the multiplexer 110, where assertion or de-assertion selects one or the other of the power supplies Vdd1, Vdd2. Although not discussed further herein, the enable logic circuitry block 124 may have further control signal outputs to other components (not shown) and may receive control signal inputs on a feedback path from those or other components (not shown). Furthermore, the enable logic circuitry block 124 may also provide control signal feedback to the power management software.

The output (Vdd_apm) of the power multiplexer 110 is provided to a load (not shown), such as memory blocks, processing blocks, or other components on a chip. Power multiplexer 110 is a 2:1 multiplexer that selects between the two power supplies Vdd1 and Vdd2 and drives the load output at a voltage Vdd_apm. The circuit of FIG. 1 is adaptive in that it is configured to select a specific power rail in response to external criteria, such as through the control signal inputs of the forward path and the control signal outputs of the feedback path. The switching signal (sel) in this example is at a voltage level (Vdd_aon) that is greater than or equal to the larger of Vdd1 and Vdd2. The switching voltage level Vdd_aon ensures that transistors within multiplexer 110 are off when Vdd_aon is applied to the control inputs (e.g., basis) of those transistors.

Power management logic within the chip may select Vdd1 or Vdd2 at a given time in accordance with an operating mode. As noted above, and an example operating system kernel may include power management software that may control power use within a chip. For instance, the power management software may determine to put one or more central processing unit (CPU) cores into a turbo mode and to raise a voltage at one or more memory blocks to support the CPU turbo mode. Similarly, the power management software may determine to put one or more CPU cores into a lower operation mode, consistent with power savings, during normal operation. In such case, the power management software may lower a voltage at one or more memory blocks. Further in this example, either raising or lowering an operating voltage at the memory blocks may include controlling a power multiplexer 110 to choose either a higher power supply or a lower power supply, consistent with an operating mode.

Figure 2:
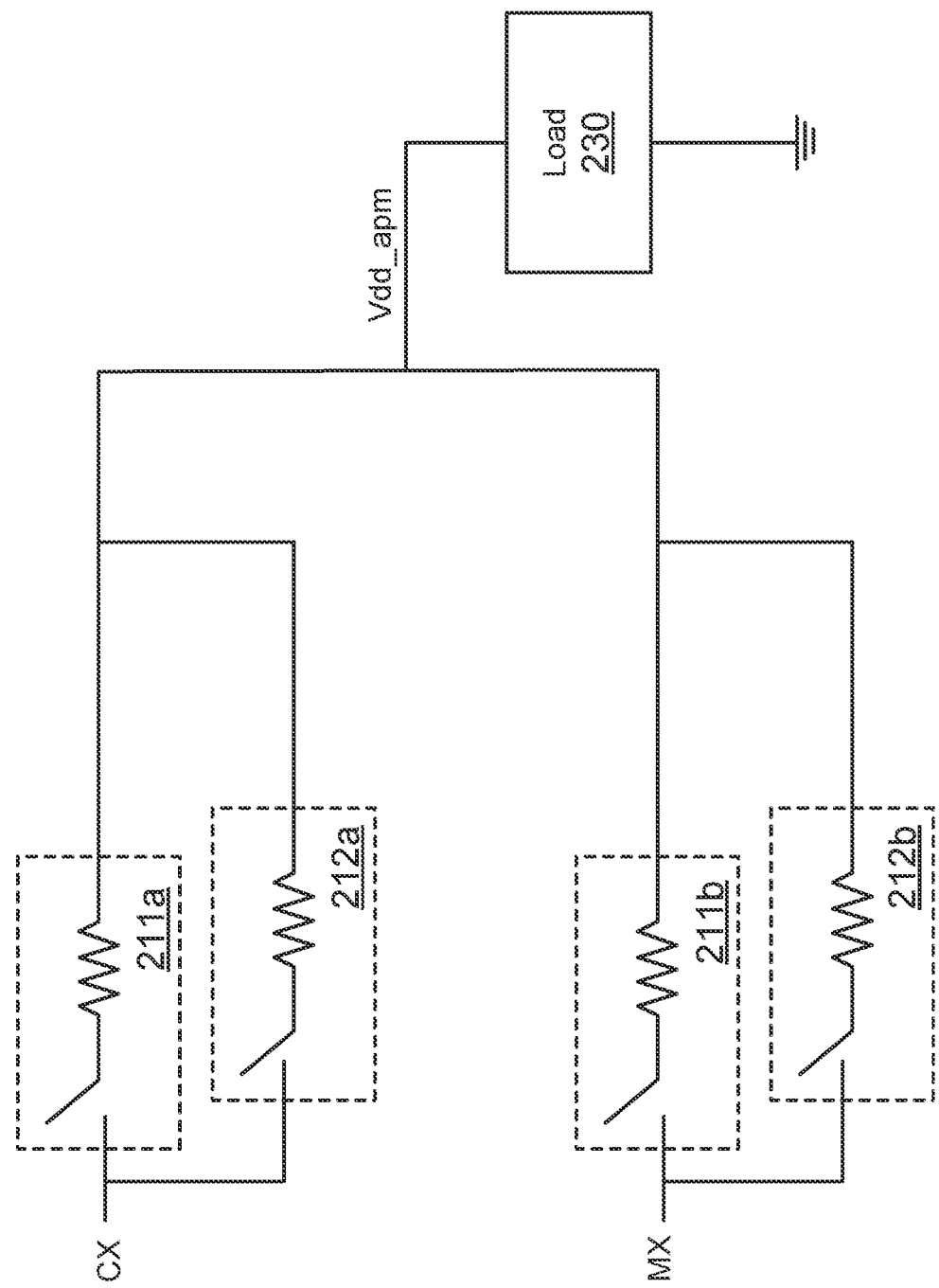
FIG. 2 is an illustration of example multiplexing circuitry, including two different types of switching logic, according to one implementation.

FIG. 2 is an illustration of an example power multiplexing architecture 200 according to one implementation. In this example, there are two power sources—a CX power source and an MX power source, and those power sources may have different voltage levels (e.g., Vdd1 and Vdd2 respectively of FIG. 1). The power multiplexing architecture 200 provides a power output Vdd_apm to the load 230 by selecting a power rail associated with the CX source or a power rail associated with the MX source. Furthermore, it is possible that the power multiplexing architecture 200 may be used to power collapse the load 230, in which case the switches 211, 212 would all be off, thereby disconnecting the load 230 from both power rails.

The power multiplexing architecture 200 includes two different switch types. The switches 211 are of a first switch type, and the switches 212 are of a second switch type. In one implementation, the switches 211 may have a lower resistance (e.g., 1 Ohm), whereas the switches 212 may have a higher resistance (e.g., 50 ohms). Of course, those values are for example, the scope of implementations is not limited to those resistance values.

Continuing with the example, the switches 212 may be used during a first time period of a voltage switching operation to prevent an inrush or outrush current from the load 230. For instance, when transitioning from power collapsed to the CX power level, from power collapsed to the MX power level, from the MX power level to the CX power level or vice versa, a switch 212 may be turned on (e.g., closed) while the switches 211 are off (e.g., open). The current then flows between the selected power rail and the load through the higher resistance switch 212. After some time has passed, for example in microseconds, the switches 212 may both be off, whereas the corresponding switch 211 may be on, thereby providing current through the lower resistance switch for the duration of steady-state operation.

For instance, assume an example in which the power multiplexing architecture 200 switches from power collapse to the voltage level associated with the power source CX. During power collapse, all of the switches 211, 212 are off. At the first part of the voltage switching operation, the architecture 200 turns a switch 212a on, which allows current to flow between the power rail of the power source CX and the load 230 at the higher resistance associated with switch 212a. After a time has passed, the architecture 200 turns on switch 211a and turns off switch 212a, thereby allowing current to flow through the lower resistance associated with switch 211a.

Each of the switches 211, 212 is shown as a single switch, but various implementations may implement each one of those switches as multiple switches. For instance, the lower-resistance switches 211 may be designed to include multiple individual transistors in parallel to achieve the lower resistance. Additionally, transistor sizes may be selected to achieve a desired resistance. The higher-resistance switches 212 may also be selected according to a number and a size to achieve the desired resistance.

The power multiplexing architecture 200 provides the same functionality as that described above with respect to the FIG. 1 implementation but with the additional use of two different types of switches 211, 212 to prevent inrush and outrush during switching operations. The two different kinds of switches 211, 212 may be referred to in some examples as rest switches (211) and few switches (212). Various implementations described herein may separate the few switches and the rest switches into a first-type power multiplexer and a second-type power multiplexer, as explained in more detail below with respect to FIG. 5. Further, there is no dependency of switches 212 on switches 211; rather, power multiplexer control is described in more detail with respect to FIG. 3 and FIG. 7.

Figure 3:
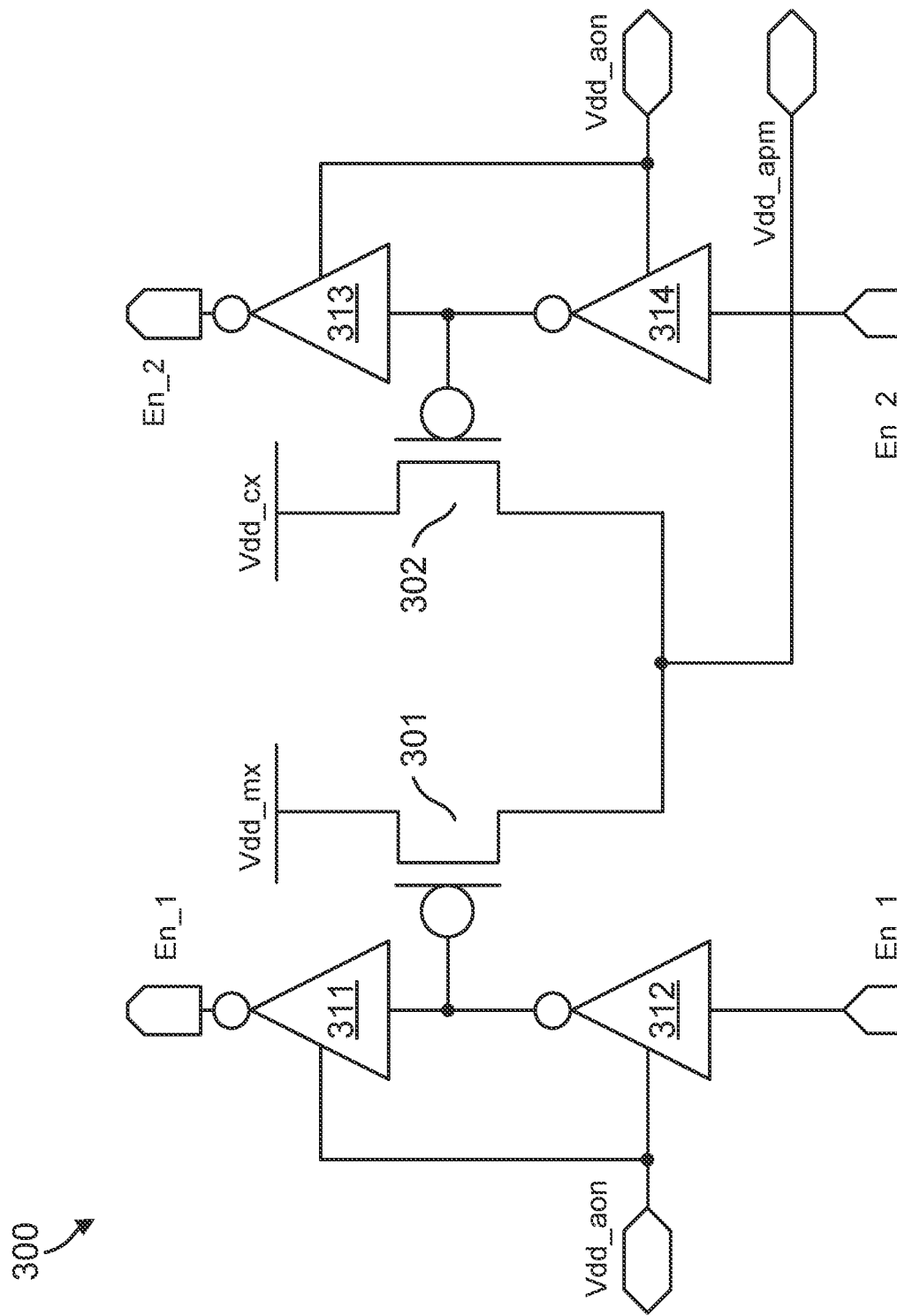
FIG. 3 illustrate an example switching logic of a power multiplexer, according to one implementation.

FIG. 3 is an illustration of an example rest switch 300, according to one implementation. For instance, the p-type metal oxide semiconductor (PMOS) transistor 301 may correspond to the switch 211b of FIG. 2, and the PMOS transistor 302 may correspond to the switch 211a.

The rest switch 300 selects between two power supplies, Vdd_mx and Vdd_cx. In one example, Vdd_mx represents a power supply that is used as a default for memory blocks, and Vdd_cx represents a variable power supply that is used by a processor. Continuing with the example, during a turbo mode of operation, Vdd_cx may be increased and may be provided to memory blocks by a power multiplexer using the rest switch 300. During a non-turbo mode of operation, the power multiplexer may select the Vdd_mx power supply for the memory blocks using rest switch 300.

The implementation of FIG. 3 includes two enable signals, En_1 and En_2 and two P-type metal oxide semiconductor (PMOS) transistors, 301 and 302. PMOS transistors 301, 302 are off when the gate-source voltage is larger than or equal to zero and are on when the gate-source voltage is negative. Therefore, when En_1 is high, and En_2 is low, transistor 301 is on and the power multiplexer selects Vdd_mx to output as Vdd_apm. On the other hand, when En_1 is low and En_2 is high, transistor 302 is on and the power multiplexer selects Vdd_cx.

Inverter buffers 311, 312 and 313, 314 illustrate drivers for the PMOS transistors 301, 302. For instance, inverter buffers 311, 312 are powered by Vdd_aon, which causes Vdd_aon to be applied to the gate of transistor 301 when the output of inverter buffers 312 is a high voltage (digital one). Similarly, inverter buffers 313, 314 are powered by Vdd_aon as well and cause Vdd_aon to be applied to the gate of transistor 302 when the output of inverter buffer 314 is a digital one.

Furthermore, the enable signals En_1 and En_2 are utilized so that only one is on at a given time, thereby preventing a scenario where Vdd_mx and Vdd_cx are shorted. Nevertheless, both En_1 and En_2 may be low, thereby selecting neither power supply.

When transistor 301 is on, and transistor 302 is off, the voltage Vdd_cx is applied at the gate of transistor 302. Vdd_aon is a switching voltage, and it is selected to be the higher of Vdd_mx and Vdd_cx, thereby ensuring that the gate-source voltage is greater than or equal to zero, even if the voltage level of Vdd_cx changes. Similarly, when transistor 301 is turned off Vdd_aon is applied at its gate, thereby ensuring that the gate-source voltage is greater than or equal to zero during its off state.

Vdd_aon may be provided by one or more voltage generators that may be separate from, or included in, power multiplexers that include one or more rest switches. Also, the enable signals represent a particular implementation of the switching signal (sel) of FIG. 1, and they may be supplied by enable logic circuitry blocks. An example technique to supply Vdd_aon is explained in more detail below with respect to FIG. 4.

Figure 4:
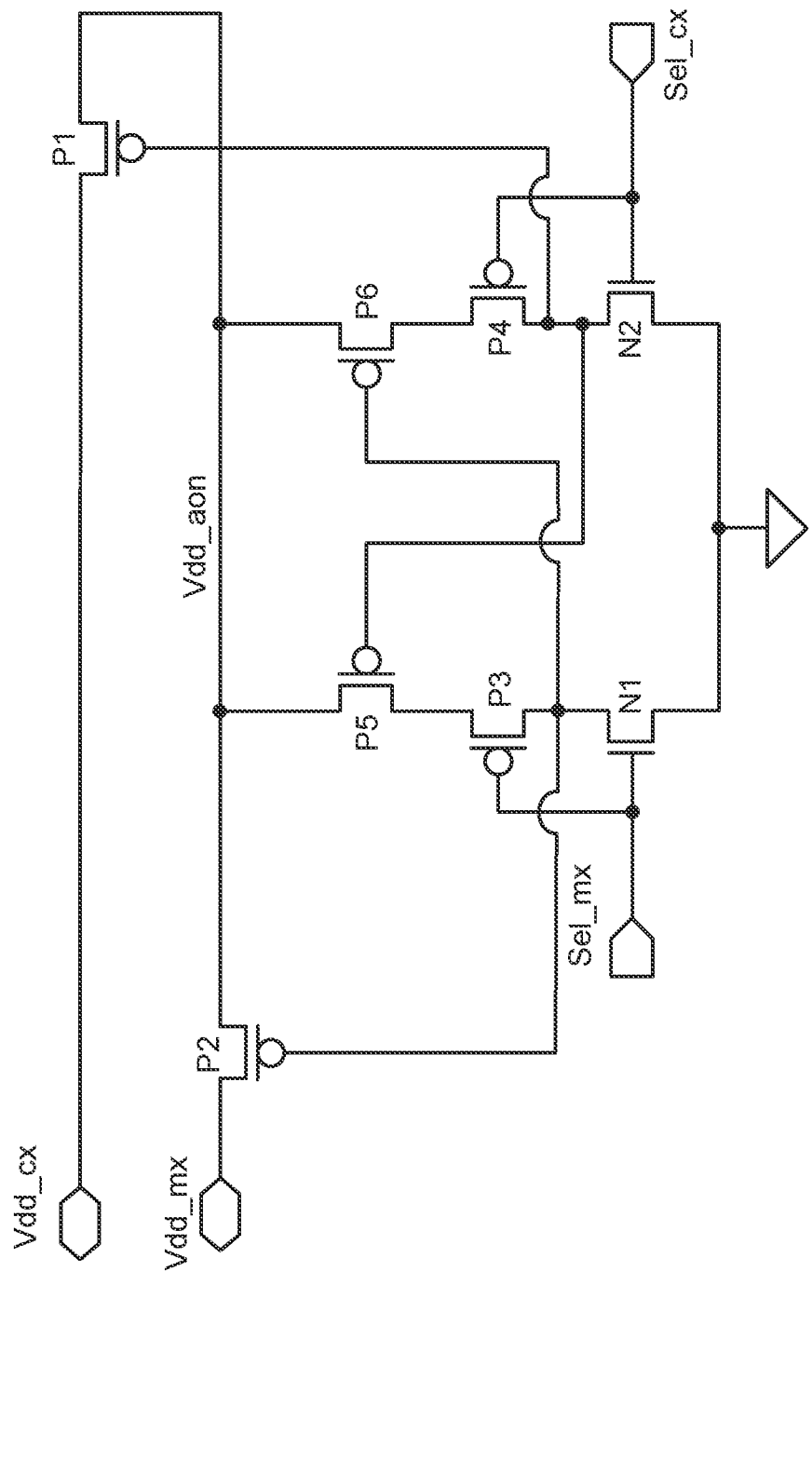
FIG. 4 is an illustration of an example switching voltage generator, according to one implementation.

FIG. 4 is an illustration of an example voltage generator 400 for the switching voltage Vdd_aon, according to one implementation. As noted above, the switching voltage Vdd_aon may be applied to transistors within the rest switches, such as transistor 301, 302 of FIG. 3.

The control signals, Sel_mx and Sel_cx may be supplied by a controller, such as controller 701 of FIG. 7, which is discussed in more detail below. Only one of the control signals Sel_mx and Sel_cx would be high (digital one) at any given time, and the control signals Sel_mx and Sel_cx cause the voltage generator 400 to select either the voltage associated with the MX power supply (Vdd_mx) or the voltage associated with the CX power supply (Vdd_cx) as the switching voltage Vdd_aon.

Although not shown in FIG. 4, the control signals Sel_mx and Sel_cx may be generated by a comparator that receives both Vdd_mx and Vdd_cx and outputs the control signals Sel_mx and Sel_cx based on comparing the voltage levels associated with Vdd_mx and Vdd_cx. For instance, if Vdd_mx is higher than Vdd_cx, the comparator may output Sel_mx as a high voltage and Sel_cx as a low voltage. Vice versa may also be true, so that if Vdd_cx is higher, Sel_mx may be output as a low voltage and Sel_cx as a high voltage.

In a first example, the control signal Sel_mx is high and the control signal Sel_cx is low. As a result, a high voltage is applied to the gates of PMOS transistor P3 and N type metal oxide semiconductor (NMOS) transistor N1. Similarly, a low voltage (digital zero) is applied to the gates of transistors P4 and N2. Transistors P3 and N2 are off, and transistors N1 and P4 are on, which applies a low voltage to the gates of transistors P2 and P6 and applies a high voltage to the gates of transistors P1 and P5. As a result, transistors P2 and P6 are on, and transistors P1 and P5 are off. The voltage Vdd_aon is therefore Vdd_mx.

In a second example, Vdd_cx is selected. The control signal Sel_mx is low and the control signal Sel_cx is high. As a result, a low voltage is applied to the gates of PMOS transistor P3 and NMOS transistor N1. A high voltage (digital one) is applied to the gates of transistors P4 and N2. Transistors P3 and N2 are on, and transistors N1 and P4 are off, which applies a high voltage to the gates of transistors P2 and P6 and applies a low voltage to the gates of transistors P1 and P5. As a result, transistors P2 and P6 are off, and transistors P1 and P5 are on. The voltage Vdd_aon is therefore Vdd_cx.

Figure 5:
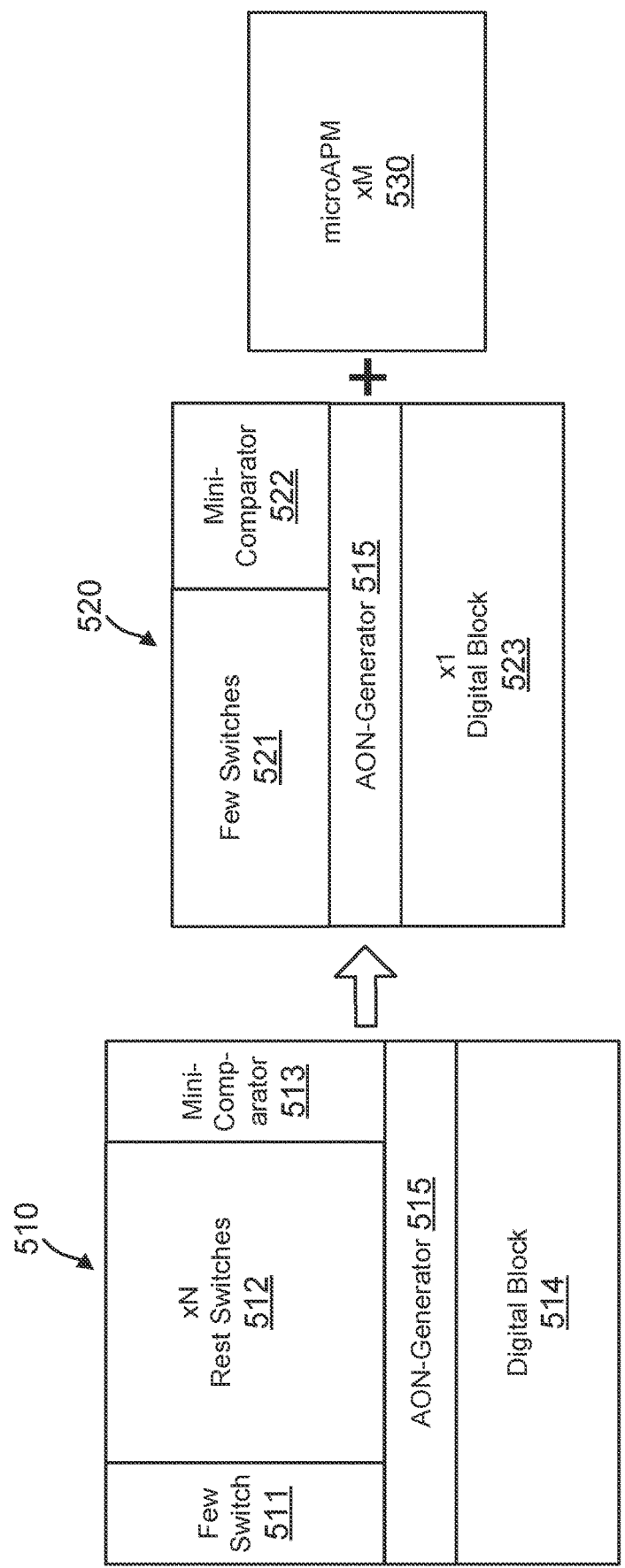
FIG. 5 is an illustration of example power multiplexing circuits, according to one implementation.

FIG. 5 is an illustration of example power multiplexors 510, 520, and 530, according to some implementations. Specifically, FIG. 5 is offered to show a contrast between example power multiplexer 510, which includes both few switches and rest switches, with an implementation that separates few switches into a first type of power multiplexer and rest switches into a second type of power multiplexer.

Looking at power multiplexer 510 first, it includes few switches 511 and rest switches 512. As noted above, in some implementations, combining few switches 511 and rest switches 512 into a single power multiplexer unit, such as a tile, may result in routing crowding. Examples of few switches 511 and rest switches 512 are provided above at FIGS. 2 and 3. Power multiplexer 510 also includes AON generator 515, which may conform to a circuit structure similar to or the same as that described above with respect to FIG. 4. Comparator 513 may be used to provide select signals to the AON generator. For instance, as described above at FIG. 4, the switching voltage generator 400 receives enable signals Sel_mx and Sel_cx, and in some implementations comparator 513 may provide the same or similar signals to AON generator 515. Digital block 514 may include digital logic which provides other enable signals to the few switches 511 and the rest switches 512 to cause the switches 511, 512 to select either MX or CX power supplies (or to power collapse a load). Examples of such enable signals include the two-bit signals provided from main tile 520 to micro-APM tiles 530 in FIG. 7 (described in more detail below).

By contrast, various implementations use two different types of power multiplexers, illustrated here as power multiplexer 520 and power multiplexer 530. Looking at power multiplexer 520, it is sometimes referred to herein as a first type of power multiplexer and sometimes as a main tile (FIG. 7). Power multiplexer 520 includes few switches 521, which may be the same as or similar to few switch 511. In some implementations, the size of the few switches 521 may be increased to a maximum size that still allows the circuit to achieve a desired resistance. Comparator 522 may be the same as or similar to comparator 513, and it may apply select signals to the AON generator 515. The digital block 523 may be the same as or similar to the digital block 514, and it may generate enable signals to cause the few switches 521 and the rest switches of micro-APM tile 530 to select one or the other (or neither) of the power supplies.

The second type of power multiplexer is illustrated as micro-APM (micro-adaptive power multiplexer) tile 530, which includes rest switches, such as one or more of the rest switches illustrated in FIG. 3. In this example, the rest switches of micro-APM 530 are driven by Vdd_aon from the AON generator 515 and controlled by enable signals from digital logic block 523. As noted above, an advantage of implementations that use a first type and a second-type power multiplexer includes that it may reduce routing crowding and use semiconductor area more efficiently than would the design of power multiplexer 510.

In some examples, there are an integer number (xM) of micro-APM tiles 530 receiving enable signals from a single power multiplexer 520. The number xM may be chosen such that the collective resistance of the multiple micro-APM tiles 530 is equal to or greater than that of xN instances of the power multiplexer 510.

Figure 6:
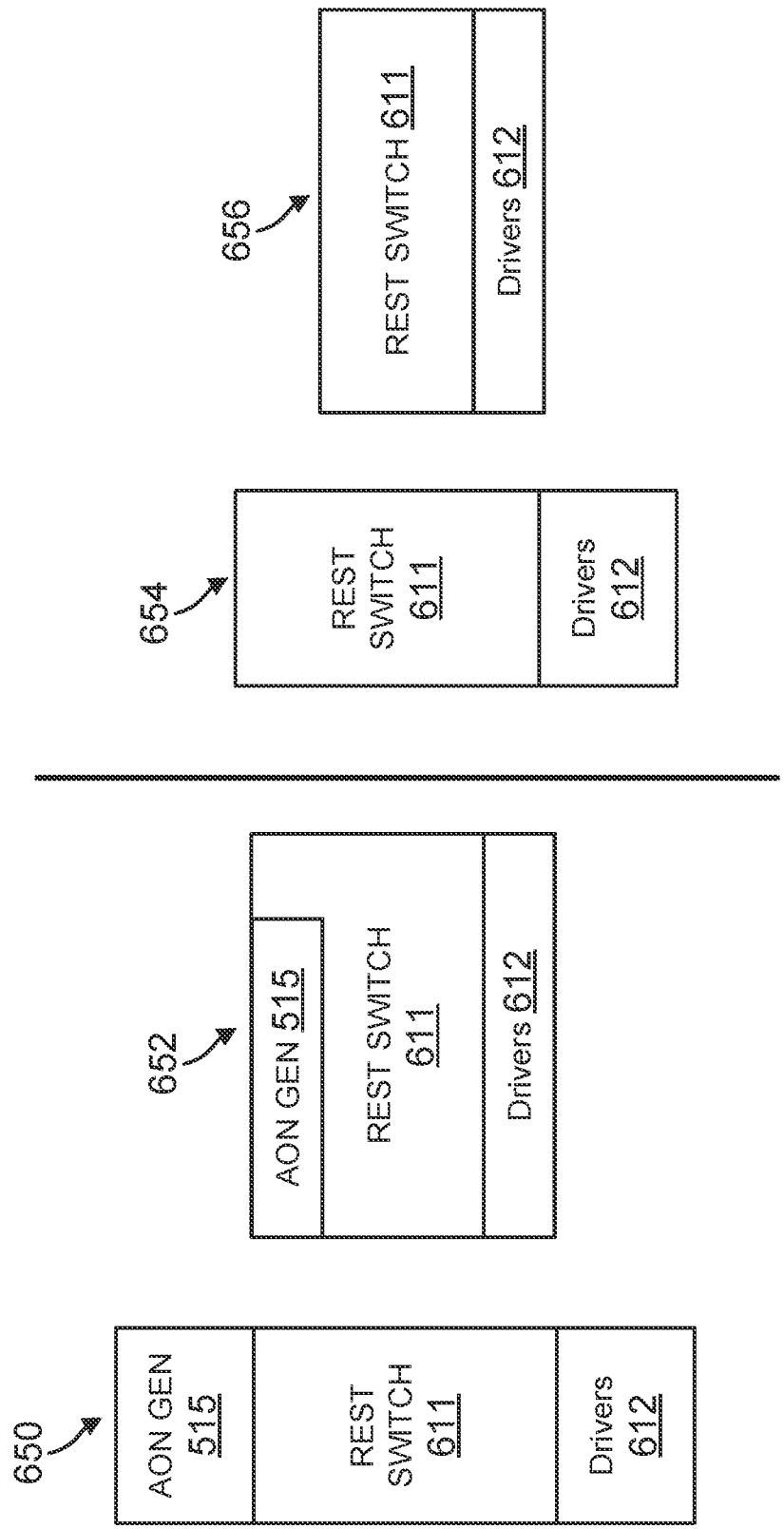
FIG. 6 is an illustration of example power multiplexing circuits, according to one implementation.

FIG. 6 is an illustration of different arrangements that may be used for the micro-APM power tile 530 of FIG. 5, according to one implementation. The arrangement 650 provides a switching voltage generator 515 within the power multiplexer along with the rest switch 611, which may be the same as or similar to the rest switch of FIG. 3. Also included in the arrangement 650 are the drivers 612, which may be the same as or similar to those implemented by inverter buffers 311-314 of FIG. 3. Arrangement 650 is built with a vertical dimension being the larger dimension. By contrast, arrangement 652 is similar to arrangement 650 but is instead implemented in horizontal channels having the horizontal dimension being the larger dimension.

Now looking at arrangement 654, it is similar to the arrangement 650, but it does not include the switching voltage generator 515. As a result, arrangement 654 is smaller than the arrangement 650. The arrangement 656 is similar to the arrangement 654 but is implemented so that its larger dimension is horizontal rather than vertical.

The implementations of FIG. 6 illustrate a concept that the second-type power multiplexer, e.g., the micro-APM tile 530 of FIG. 5, may or may not include a switching voltage generator 515. If the switching voltage generator 515 is not included in the micro-APM tile, then it may be included in another place within the chip, but at the expense of switching voltage routing among the different micro-APM tiles. This concept is discussed further with respect to FIGS. 8-11.

Figure 7:
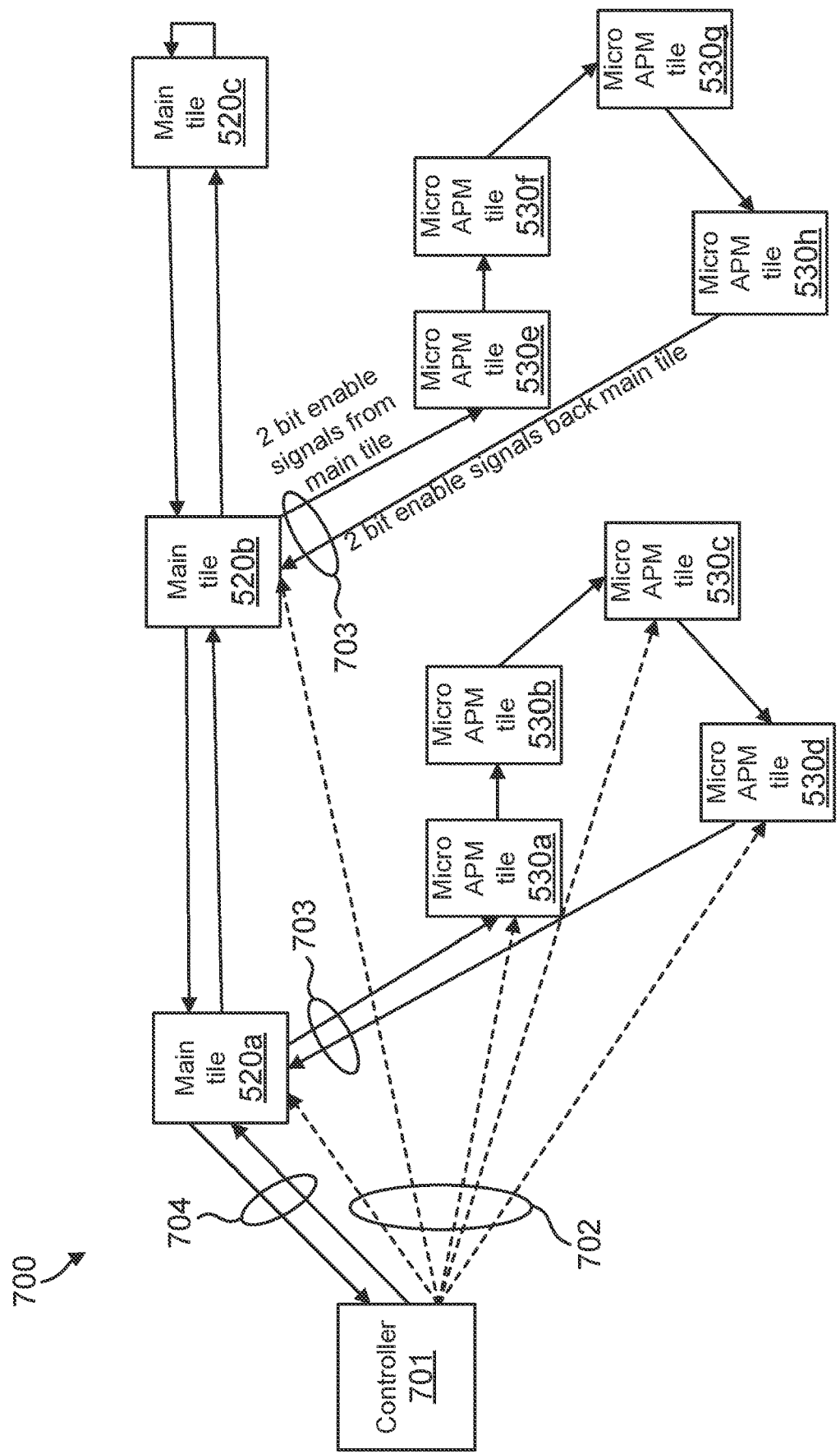
FIG. 7 is an illustration of an example power distribution network (PDN) using multiple types of power multiplexers, according to one implementation.

FIG. 7 is an illustration of an example power multiplexing architecture 700, according to one implementation. Power multiplexing architecture 700 includes main tiles 520, micro-APM tiles 530, and controller 701. The main tiles 520 include few switches as switching logic, such as described above with respect to FIG. 5. Specifically, the main tiles 520 of FIG. 7 may be implemented the same as or similar to the first-type power multiplexer 520 of FIG. 5.

The micro-APM tiles 530 may be the same as or similar to the second-type power multiplexers 530 of FIGS. 5 and 6. The controller 701 may include a processing unit that controls the main tiles 520, using control signals 704, to select a power rail or to power collapse the loads (not shown). For instance, the main tiles 520 may decode control signals 704 to generate control signals 703. The main tiles 520 are arranged in a daisy chain with respect to each other and controller 701. In one implementation, controller 701 controls main tile 520*a* to select a power rail MX. Main tile 520*a* then controls the micro-APM tiles 530*a-d* to select the power rail MX. For instance, main tile 520*a* may use control signals 703, which correspond to enable signals En_1 and En_2 of FIG. 3, to control the micro-APM tiles 530*a-d*. The micro-APM tiles 530*a-d* are also arranged in a loop so that micro-APM tile 530*a* receives control signal 703 first, and the control signal 703 is passed to the micro-APM tiles 530*b-d* and back to the main tile 520*a*.

Once the main tile 520*a* receives a control signal 703 from the micro-APM tile 530 D, main tile 520*a* then passes control signal 704 to main tile 520*b*, and main tile 520*b* then performs power multiplexing the same as or similar to main tile 520*a*. For instance, main tile 520*b* also has micro-APM tiles 530*e-h* in a loop and causes micro-APM tiles 530*e-h* to perform power multiplexing, and once main tile 520*b* receives the control signal 703 from micro-APM tile 530*h*, main tile 520*b* may then transmit the control signal 704 to main tile 520*c*. Of course, the scope of implementations is not limited to the specific number of main tiles 520 or micro-APM tiles 530 that are shown in FIG. 7. Rather, the architecture 700 may be scaled as appropriate for a given application.

The micro-APM tiles 530*a-d* are arranged in a loop, thereby allowing either main tile 520*a* or controller 701 to check for faults. The same is true for the loop that includes micro-APM tiles 530*e-h*. The daisy chain arrangement of main tiles 520*a*-520*c* allows the controller 701 to check for faults of the main tiles 520 in a similar manner. Furthermore, in the example of FIG. 7, there are fewer main tiles 520 than there are micro-APM tiles 530, which may lead to the few switches within the main tiles 520 carrying larger currents than would be expected of the rest switches in the micro-APM tiles 530. Therefore, the sizes of the few switches within the main tiles 520 may be sized appropriately for an expected current.

In the example of FIG. 7, micro-APM tiles 530*a-d* include switching voltage generators, such as switching voltage generator 515 of FIGS. 5 and 6. Accordingly, controller 701 may include a comparator that passes control signal 702 to each of the micro-APM tiles 530*a-d*. The control signal 702 may correspond to Sel_mx and Sel_cx of FIG. 4. In some implementations, the main tiles 520*a* and 520*b* may also include switching voltage generators and may also receive control signal 702 as well.

Although not shown in FIG. 7, each of the main tiles 520 and each of the micro-APM tiles 530 may be coupled to a load, such as illustrated generally above at FIG. 2. For instance, each of the micro-APM tiles 530*a-d* powers a different load, such as different memory blocks within a memory unit or different processing circuits, and the main tile 520*a* powers each of those different loads associated with each of the micro-APM tiles 530*a-d*. As noted above, the main tiles 520 include few switches for higher resistance, and the micro-APM tiles 530 include rest switches for lower resistance.

Figure 13:
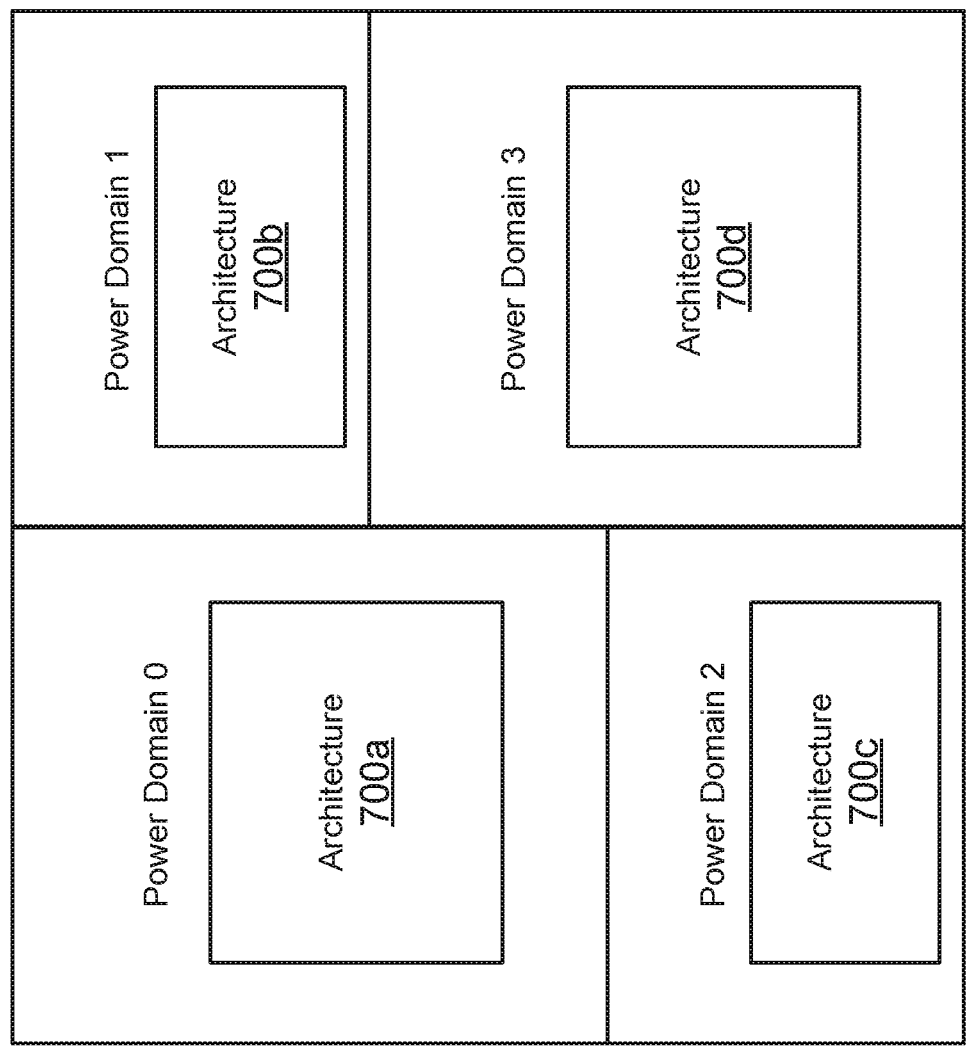
FIG. 13 is an illustration of an example chip, having power multiplexing according to the principles described herein, according to one implementation.

The architecture 700 provides a PDN for a given power domain within a chip. Therefore, each of the main tiles 520 and micro-APM tiles 530 would be expected to select the same voltage (e.g., either MX or CX) or power collapse at a given time. In other words, the PDN illustrated by architecture 700 would not mix and match voltage levels. To the extent that the chip may have other power domains that operate independently, the chip may implement one or more other PDNs which have the same or similar structure as shown in FIG. 7. An example is shown in FIG. 13, where example chip 1300 includes power domains 0-3. Each of the different power domains includes a PDN according to the architecture 700. The example chip 1300 may include a central processing unit (CPU), a graphics processing unit (GPU), a memory, a modem, and the like in a system on chip (SOC). However, the scope of implementations is not limited to an SOC, as the power multiplexing described herein may be applied to any chip having memory and/or processing.

Figure 8:
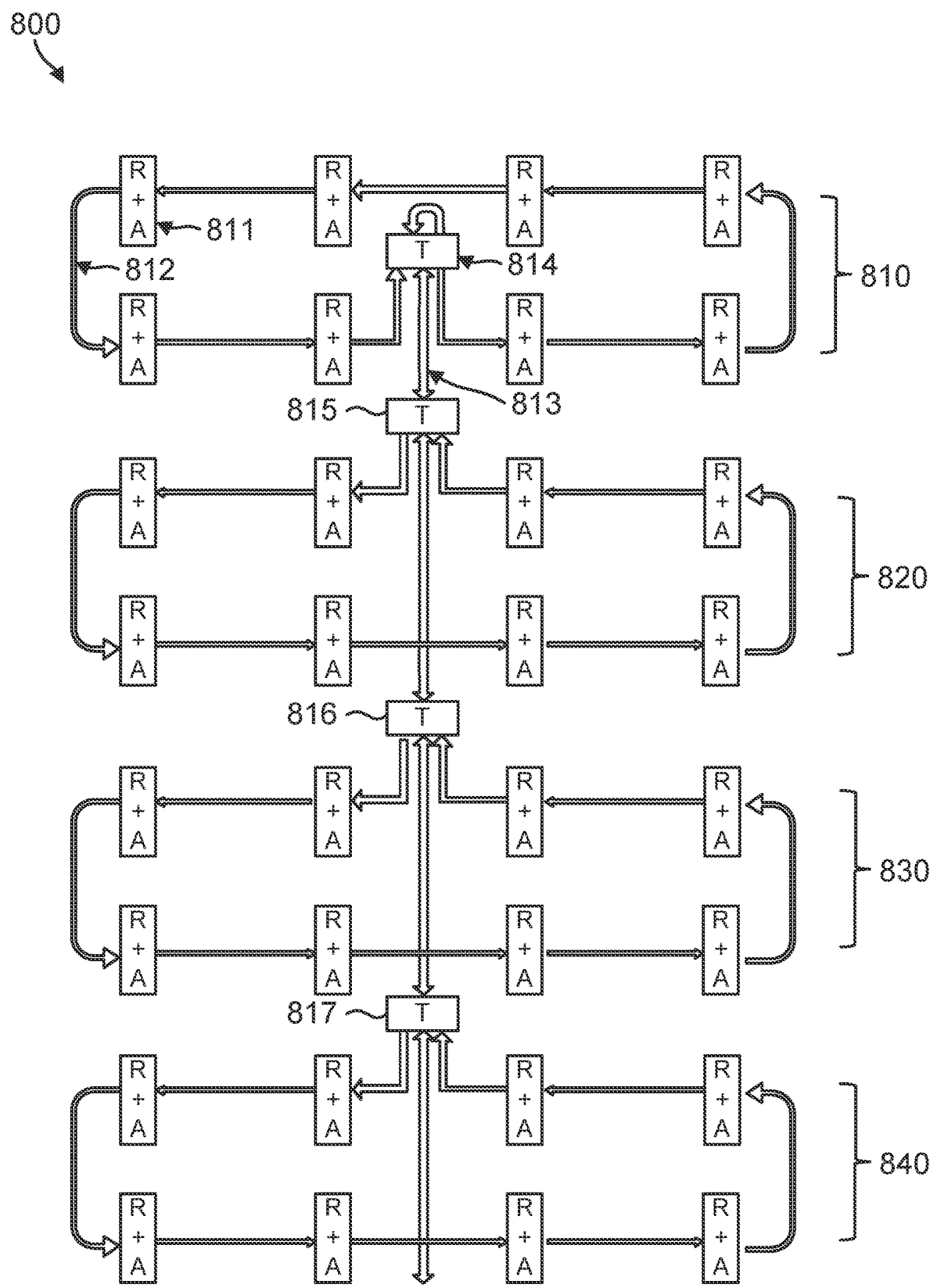
FIGS. 8-10 show an example PDNs, according to one implementation.
Figure 9:
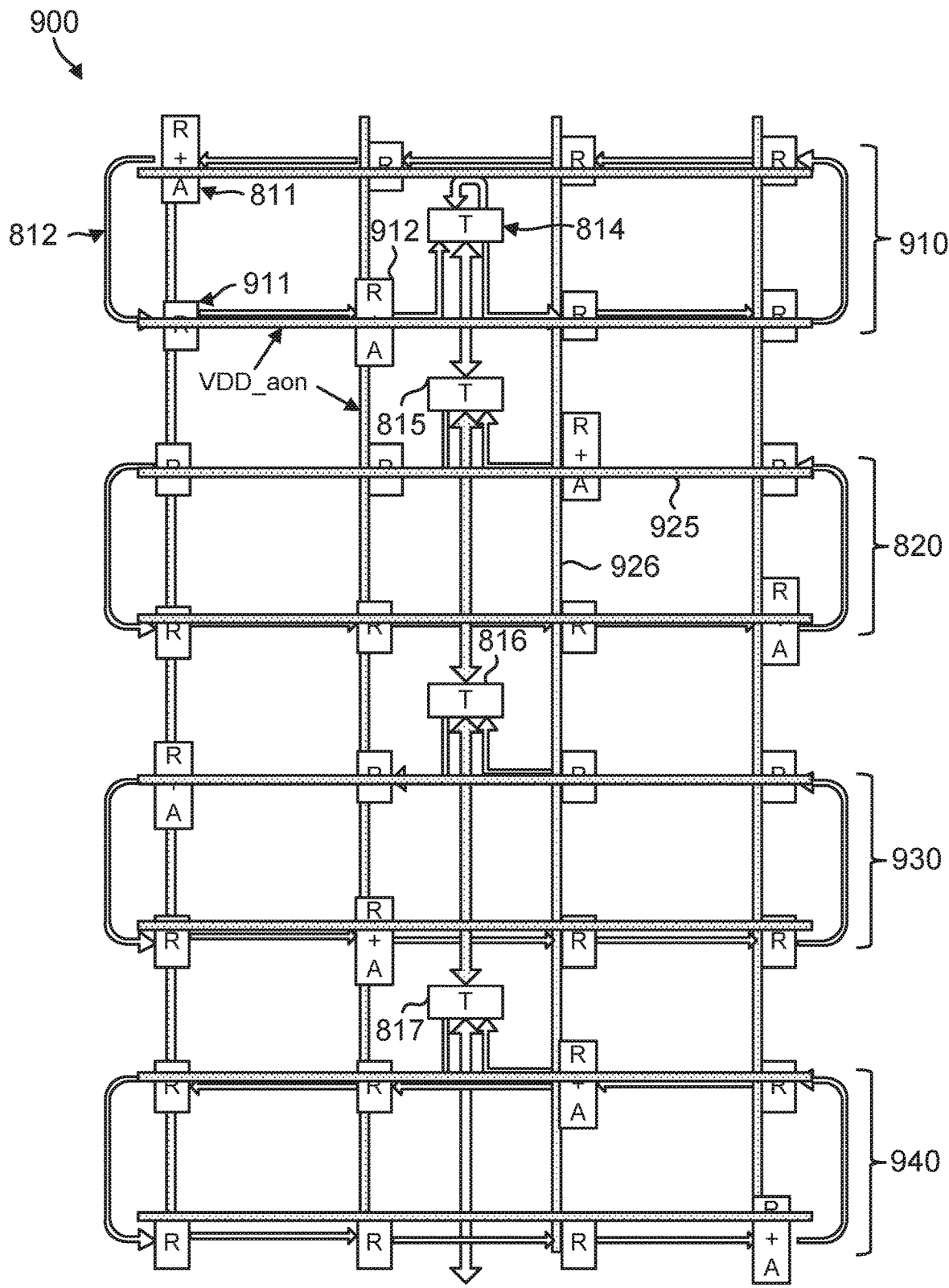
Figure 10:
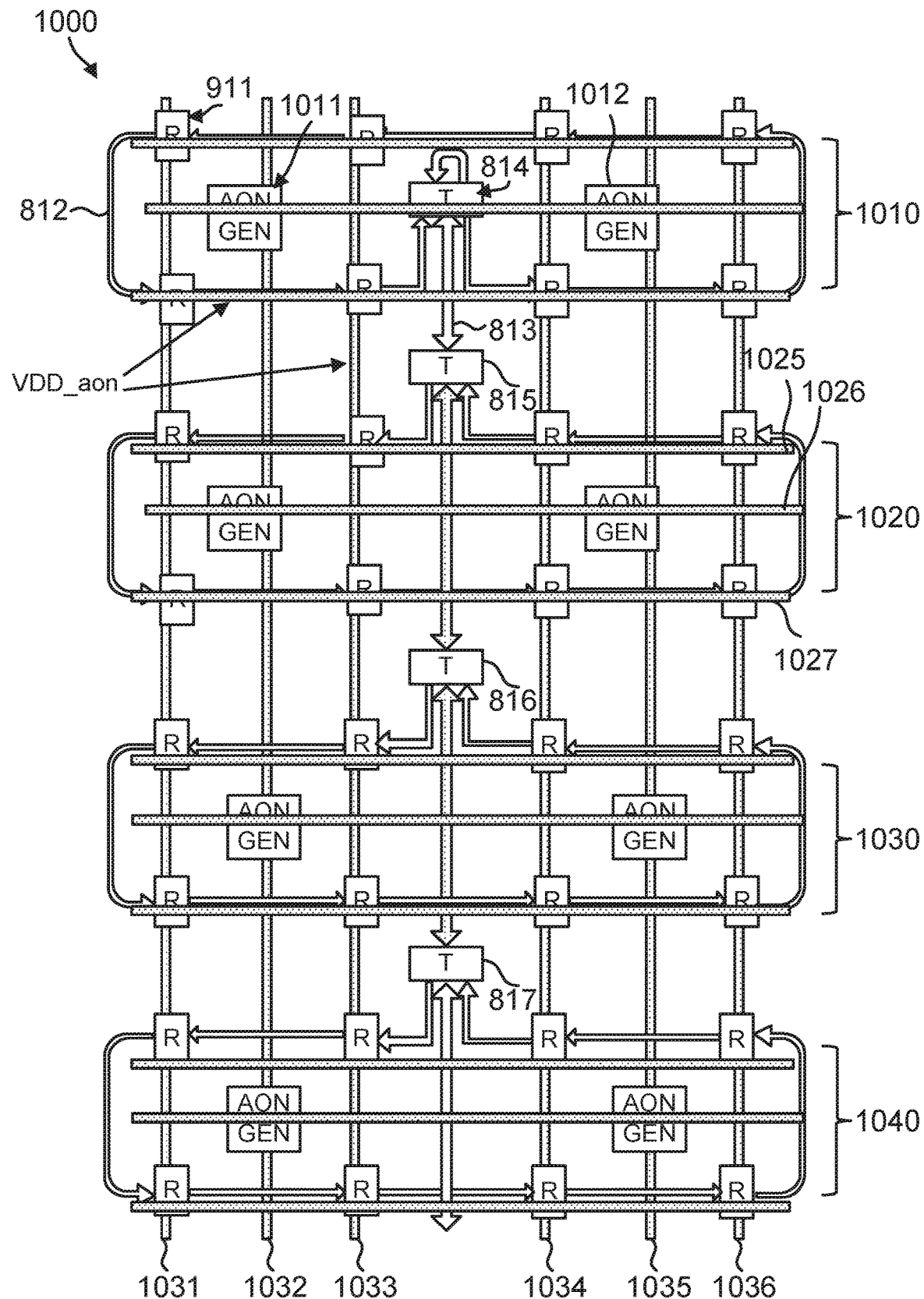

FIGS. 8-10 show different arrangements for PDNs according to a variety of implementations. For instance, the basic building blocks of main tiles and micro-APMs may be mixed and matched to implement adaptive power multiplexing systems with different trade-offs of voltage drop, semiconductor area, routing congestion, and the like. As noted above, with the rest switches of the micro-APMs separated from the few switches of the main tiles, the pitch of the different tiles can be increased or decreased as appropriate.

For instance, choice of tile pitch may take into account various factors, such as Vdd_aon rail droop during multiplexer switching, where Vdd_aon rail droop may be a function of few switch strength, leakage of load, parasitic capacitance on the Vdd_aon rail, and the like. In some implementations, stronger few switches may lead to lower droop, load leakage may lead to higher droop, and longer Vdd_aon rails may lead to increased parasitic capacitance. In the case of Vdd_aon rails, length may be affected by the placement of the switching voltage generators within the PDN. In a scenario in which each micro-APM includes a switching voltage generator, Vdd_aon (the switching voltage) routing may be minimal. By contrast, implementations that include standalone switching voltage generators or dispose switching voltage generators in only a few micro-APMs may see increased switching voltage routing, including longer length Vdd_aon rails.

However, engineering trade-offs may apply to each of those situations. For instance, switching voltage generators in each micro-APM may result in larger micro-APMs while minimizing Vdd_aon rail droop, whereas moving Vdd_aon generators to only a few micro-APMs or to standalone circuits may allow for simpler micro-APMs but at the cost of increased voltage routing.

Looking to FIG. 8 first, it illustrates example PDN 800, according to one implementation. The micro-APM tiles are exemplified by micro-APM tile 811. Micro-APM tile 811 is included within loop 810, and the other loops 820, 830, and 840 are implemented the same as or similar to loop 810. Loop 810 includes main tile 814, which may be the same as or similar to main tile 520 of FIGS. 5 and 7, and main tile 814 may communicate with the micro-APMs by communication pathway 812, which carries control signals, such as control signals 703 of FIG. 7.

The main tiles 814-817 may be arranged in a daisy chain loop, such as is illustrated in FIG. 7. Communication pathway 813 carries control signals, such as control signals 704 of FIG. 7.

Of note in FIG. 8 is that each of the micro-APM tiles (e.g., micro-APM tile 811) includes rest switches, as switching logic, and a switching voltage generator. In other words, each of the micro-APM tiles generates its own switching voltage (Vdd_aon), thereby reducing or eliminating any need to route the switching voltage between micro-APM tiles. Thus, the implementation of FIG. 8 trades the cost of larger and more complex micro-APM tiles for a reduction in switching voltage routing.

FIG. 9 is an illustration of PDN 900, according to one implementation. PDN 900 is similar to PDN 800, as communication pathways 812 and 813 are the same, and the main tiles 814-817 are arranged in the same daisy chain, and the loops 910, 920, 930, 940 have the same shape as the loops 810, 820, 830, 840.

A difference between PDN 900 and PDN 800 is that PDN 900 includes only two micro-APM tiles with integrated switching voltage generators per loop. Taking loop 910 as an example, it includes micro-APM tiles 811, 912 having integrated switching voltage generators. The remaining micro-APM tiles (exemplified by micro-APM tile 911) in the loop 910 include rest switches but do not include integrated switching voltage generators. In other words, micro-APM tile 911 may be the same as or similar to items 654, 656 of FIG. 6, whereas micro-APM tiles 811, 912 may be the same as or similar to items 650, 652 of FIG. 6. As a result, PDN 900 utilizes switching voltage routing to provide the switching voltage to the ones of the micro-APM tiles that do not have integrated switching voltage generators. The switching voltage routing employs horizontal routing, as exemplified by power rail 925, and vertical routing, as exemplified by power rail 926.

Micro-APM tiles, such as micro-APM tile 911, is smaller and less complex than micro-APM tiles 811, 912 by virtue of not including an integrated switching voltage generator. Smaller micro-APM tiles, such as micro-APM tile 911, may allow for more granular placement for switching logic, which may allow such micro-APM tiles to be placed more closely together and shorten the communication path 812. However, switching voltage distribution overhead is higher than it is in PDN 800, and switching voltage distribution would generally be expected to be more complex as the ratio of micro-APM tiles 911 to micro-APM tiles 811 increases.

FIG. 10 is an illustration of PDN 1000, according to one implementation. PDN 1000 is different from PDN 800 and PDN 900 because in PDN 1000 none of the micro-APM tiles includes integrated switching voltage generation. Rather, each of the loops 1010, 1020, 1030, 1040 are made using the smaller micro-APM tiles, such as micro-APM tile 911. Switching voltage generation is provided by stand-alone switching voltage generation units 1011, 1012 in loop 1010. The other loops 1020, 1030, 1040 are constructed similarly to loop 1010.

The use of standalone switching voltage generation units 1011, 1012 is accompanied by a more complex voltage routing structure than is seen in either PDN 800 or PDN 900. The switching voltage distribution as exemplified by horizontal power rails 1025, 1026, 1027 (for loop 1020) and vertical power rails 1031-1036, which serve each of the loops 1010, 1020, 1030, 1040. PDN 1000 represents a further trade-off between using smaller micro-APM tiles 911, which may allow more granular placement of rest switches, and more complex switching voltage routing.

Of course, the examples of FIGS. 8-10 are for example only. A number of micro-APM tiles within a loop, a number of loops, a number of main tiles, and a number of switching voltage rails may be tailored to be appropriate for a given application. In other words, the particular structures of the implementations of FIGS. 8-10 may be modified as appropriate to deliver desired voltage to a given number of loads within an application.

Figure 11:
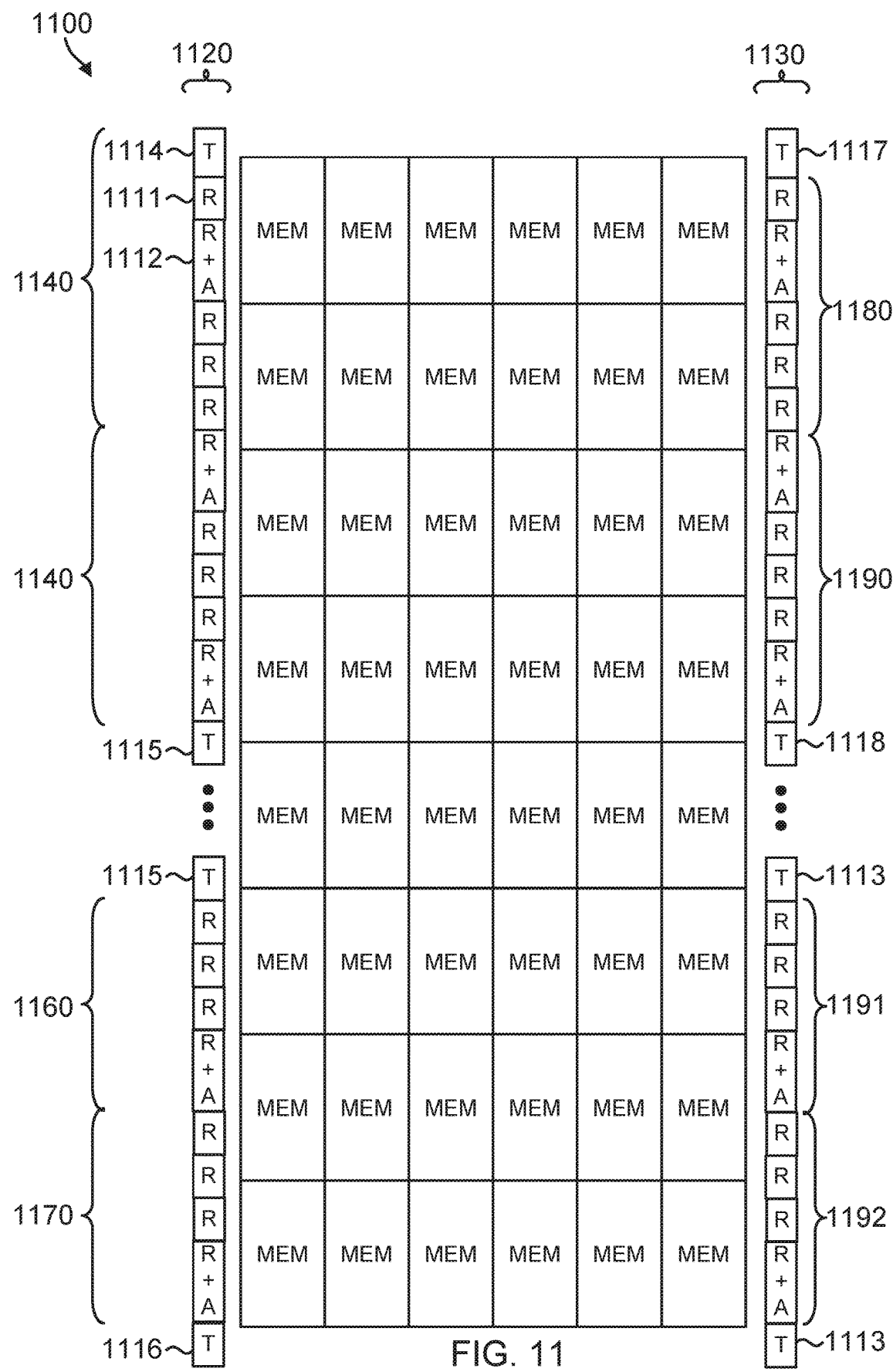
FIG. 11 shows an example application of a PDN as applied to a memory device, according to one implementation.

FIG. 11 is an illustration of an example PDN 1100 as applied to a memory device 1110, according to one implementation. Memory device 1110 may be any appropriate memory device, such as a group of static random-access memory (SRAM) memory blocks, or the like. The power multiplexing functionality is arranged in the columns 1120 and 1130. The power multiplexing functionality is provided by main tiles 1113-1119, and the micro-APM tiles are exemplified by micro-APM tile 112 having an integrated switching voltage generator and micro-APM tile 1111 which does not have an integrated switching voltage generator. The micro-APM tiles may be arranged in loops, such as shown in FIGS. 8-10. For instance, example loops are shown as items 1140, 1150, 1160, 1170, 1180, 1190, 1191, and 1192.

FIG. 11 is offered to show that the power multiplexing hardware may be arranged physically on a chip in any appropriate manner. Specifically, in FIG. 11, the power multiplexing hardware is arranged in the columns 1120, 1130 on opposing sides of memory device 1110. Although not shown in FIG. 11, the main tiles 1113-1119 may be daisy-chained, such as shown in FIGS. 7-10, and the micro-APM tiles may be arranged in loops 1140, 1150, 1160, 1170, 1180, 1190, 1191, and 1192 as described above with respect to FIGS. 7-10.

Furthermore, each of the loops 1140, 1150, 1160, 1170, 1180, 1190, 1191, and 1192 may serve the individual memory blocks within the memory device 1110 in any appropriate way. For instance, each one of the loops 1140, 1150, 1160, 1170, 1180, 1190, 1191, and 1192 may serve the ones of the memory blocks that are physically closest, reaching from a respective side to the middle so that each one of the blocks within the memory device 110 is served by at least one power multiplexing loop.

Of course, the scope of implementations is not limited to the physical arrangement shown in FIG. 11. Rather, other implementations may distribute micro-APM tiles around a chip as appropriate.

The implementations described above with respect to the FIGS. 5-11 may offer advantages over other designs that use only a single type of power multiplexer that combines both few switches and rest switches. As noted above, designs that combine few switches and rest switches into a single, physical power multiplexing structure may incur routing costs to at least in part to the large numbers of transistors that make up the switching logic (the few switches and rest switches). Specifically, the routing costs may include using an undesirable number of metal layers within a chip. Metal routing in a chip may be of a nature such that increased vertical use of metal layers by a component may cause further horizontal use of routing space. Therefore, not only may the routing be more complicated, but additionally the routing may use an undesirable amount of silicon area.

By contrast, various implementations described herein may use at least two types of power multiplexers. The first type of power multiplexers (e.g., main tiles 520) may include higher resistance switching logic (e.g., few switches), and the second type of power multiplexers (e.g., micro-APM tiles 530) may include lower resistance switching logic (e.g., rest switches). The first type of power multiplexers are physically separate from the second type of power multiplexers, and implementations may include communication paths to provide enable signals from the first type of power multiplexer, through a loop of the second type of power multiplexers, and back to the first type of power multiplexer. The physical separateness of the two different types of power multiplexers may result in a smaller number of metal layers being used for routing and, therefore, less silicon area being used in total for the same power multiplexing functionality. Decreased routing complexity and less use of semiconductor area may translate to lower cost of production.

Figure 12:
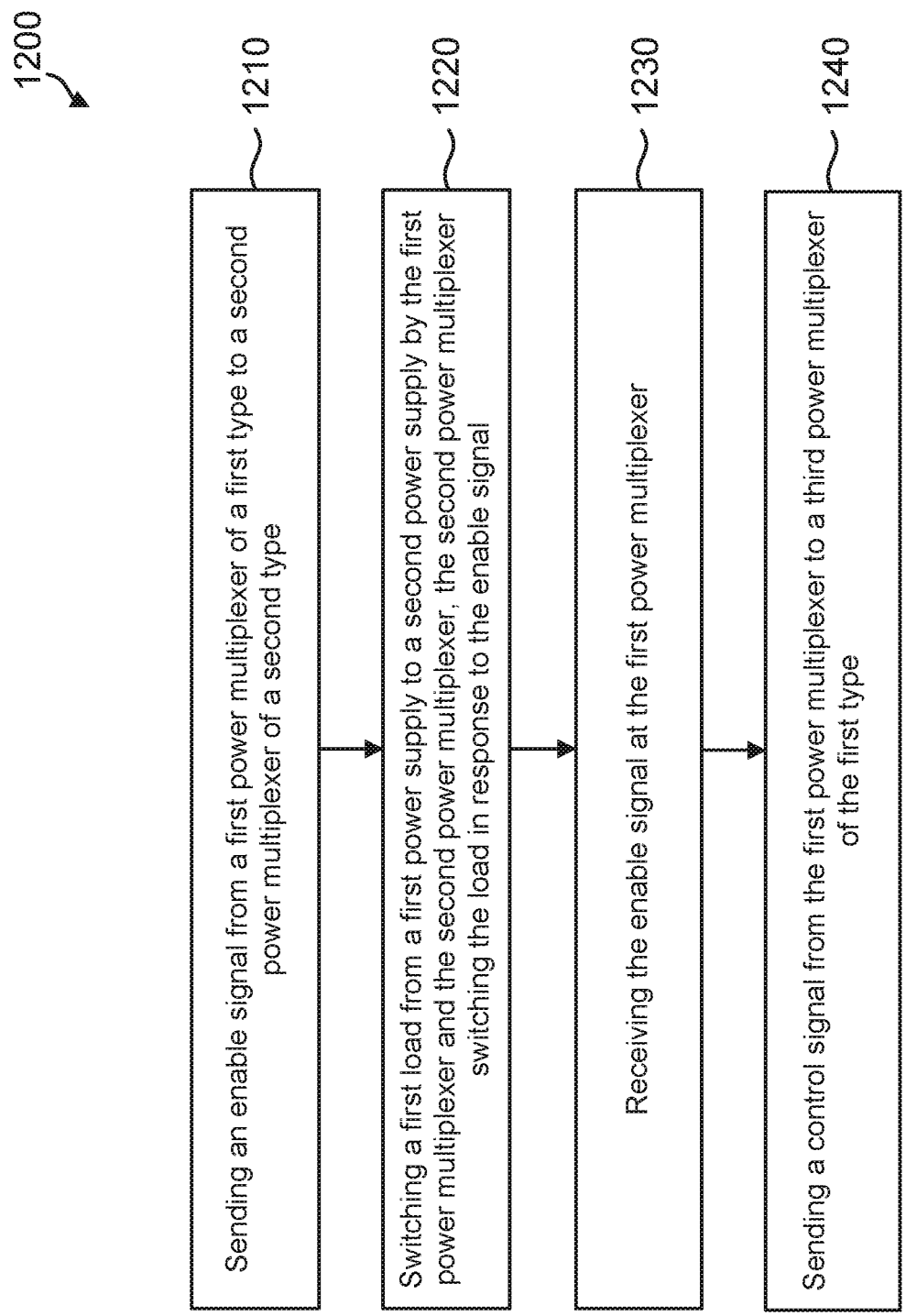
FIG. 12 is an illustration of an example method, adapted according to one implementation.

A flow diagram of an example method 1200 of multiplexing between multiple power supplies is illustrated in FIG. 12. In one example, method 1200 is performed by the circuits shown in FIGS. 1-11. The circuits may operate under control of a power management unit, which may include hardware and/or software functionality at a processor (e.g., CPU) of a computing device included within an SOC (not shown) or other structure. For instance, the controller 701 of FIG. 7 may represent a standalone controller or hardware and/or software functionality at another processing device, such as a CPU or other processor. In some examples, a power management unit includes processing circuitry that executes computer readable instructions to select one power supply or another power supply as an operating voltage for one or more memory blocks.

At action 1210, the system sends an enable signal from a first power multiplexer of a first type to a second power multiplexer of a second type. An example is shown in FIG. 7, where main tile 520a sends a control signal 703 to the micro-APM tiles 530a-d. In that example, the control signal 703 may include an enable signal, such as En_1 and En_2 of FIG. 3.

At action 1220, the system switches a first load from a first power supply to a second power supply by the first power multiplexer and by the second power multiplexer. Looking to the example of FIG. 7, the main tile 520a switches a load from a first power supply to a second power supply (e.g., from CX to MX or vice versa) and causes micro-APM tiles 530 to also switch their respective loads from the first power supply to the second power supply. The first power multiplexer may be caused to switch from the first power supply to the second power supply in response to a signal from a controller, and the second power multiplexer may be caused to switch from the first power supply to the second power supply by the enable signal. While each of the individual micro-APM tiles 530a-d serve a respective load, the main tile 520a serves each of those different loads and switches the power supply for each of those different loads.

Furthermore, each of the first power multiplexer and the second power multiplexer may receive a switching voltage that is higher than or equal to the highest voltage level of the first power supply and the second power supply. An example is described with respect to FIG. 4, where a switching voltage generator 400 is illustrated and generates Vdd_aon.

At action 1230, the first power multiplexer receives the enable signal. For example, in the implementation of FIG. 7, the micro-APM tiles 530 are in a loop, and the control signal 703 is fed back to the main tile 520a. In some examples, the control signal 703 being fed back to the main tile 520a allows the main tile 520a to confirm operability of the micro-APM tiles 530 in the loop.

At action 1240, the first power multiplexer may send a control signal on to a third power multiplexer, where the third power multiplexer is of the first type. An example is shown in FIG. 7, in which main tile 520a may send control signal 704 to main tile 520b subsequent to receiving control signal 703 from micro-APM tile 530b. Main tile 520b may also have a loop of micro-APM tiles 530 and may further send the same control signal 704 to an additional main tile 520c after its loop passes the control signal 703 back to the main tile 520b. This action may be performed for each main tile 520 in a daisy chain, one after the other, until the control signal 704 is fed back to the controller 701. The result is that each of the main tiles 520 and their respective loops of micro-APM tiles 530 may switch their respective loads from the first power supply to the second power supply.

The scope of implementations is not limited to the actions shown in FIG. 12 rather, other implementations may add, omit, rearrange, or modify one or more the actions. In another example, rather than switching from the first power supply to the second power supply, the main tiles 520 and the micro-APM tiles 530 may switch from the second power supply to the first power supply or may power collapse their loads altogether. Additionally, some implementations may include repeating actions 1210-1240 multiple times during normal operation as a processor on a chip goes from one power mode to another power mode.

Various implementations are further described with respect to the following clauses:

1. A System on Chip (SOC) Comprising:
a first power multiplexer of a first type coupled to a first power supply and a second power supply, the first power multiplexer including: first switching logic disposed between the first power supply, the second power supply and a load; and
a second power multiplexer of a second type coupled to the first power supply and the second power supply, the second power multiplexer including: second switching logic between the first power supply and the second power supply and the load, the second switching logic including an enable input coupled to the first power multiplexer.

2. The SOC of clause 1, wherein the first switching logic includes a first plurality of P-type metal oxide semiconductor (PMOS) transistors, and wherein the second switching logic includes a second plurality of PMOS transistors, further wherein the first plurality of PMOS transistors are smaller in size than the second plurality of PMOS transistors.

3. The SOC of clause 1, wherein the first switching logic includes a first plurality of P-type metal oxide semiconductor (PMOS) transistors, and wherein the second switching logic includes a second plurality of PMOS transistors, further wherein the first plurality of PMOS transistors have a collective resistance that is smaller than that of the second plurality of PMOS transistors.

4. The SOC of any of clauses 1-3, further comprising:
a third power multiplexer of the second type coupled to the first power supply and the second power supply, the third power multiplexer including: third switching logic between the first power supply and the second power supply and another load, the third switching logic including an additional enable input coupled to the first power multiplexer;
wherein the second power multiplexer and the third power multiplexer are coupled in a loop with the first power multiplexer.

5. The SOC of clause 4, wherein the loop comprises a first path from the first power multiplexer to the enable input of the second switching logic, second path from the enable input of the second switching logic to the additional enable input, and a third path from the additional enable input to the first power multiplexer.

6. The SOC of clause 4, wherein the second power multiplexer includes a first voltage generator configured to provide a switching voltage to the second switching logic, further wherein the third power multiplexer includes a second voltage generator configured to provide the switching voltage to the third switching logic.

7. The SOC of clause 4, wherein the second power multiplexer includes a first voltage generator configured to provide a switching voltage to the second switching logic and to the third switching logic.

8. The SOC of clause 4, further comprising a first voltage generator physically separate from the first power multiplexer and from the second power multiplexer, the first voltage generator being configured to provide a switching voltage to the second switching logic and to the third switching logic.

9. The SOC of clause 1, further comprising:
a fourth power multiplexer of the second type coupled to the first power supply and the second power supply, the fourth power multiplexer including: fourth switching logic between the first power supply and the second power supply and another load, the fourth switching logic including an additional enable input coupled to the first power multiplexer;
a control circuit coupled to a plurality of voltage generators associated with each of the first power multiplexer, the second power multiplexer, and the fourth power multiplexer.

10. The SOC of clause 9, wherein the control circuit includes a comparator coupled to the first power supply and to the second power supply, wherein an output of the comparator is coupled to the plurality of voltage generators.

11. The SOC of clause 1, further comprising:
a fifth power multiplexer of the second type coupled to the first power supply and the second power supply, the fifth power multiplexer including: fifth switching logic between the first power supply and the second power supply and another load, the fifth switching logic including an additional enable input coupled to the first power multiplexer;
a plurality of memory bit cells arranged in a plurality of rows and a plurality of columns;
wherein the first power multiplexer, the second power multiplexer, and the fifth power multiplexer are arranged in a column parallel to a first column of the plurality of columns;
wherein the second power multiplexer includes a first voltage generator configured to provide a switching voltage to the second switching logic, to the fifth switching logic.

12. A method comprising:
sending an enable signal from a first power multiplexer of a first type to a second power multiplexer of a second type;
switching a first load from a first power supply to a second power supply by the first power multiplexer and the second power multiplexer, the second power multiplexer switching the first load in response to the enable signal;
receiving the enable signal at the first power multiplexer.

13. The method of clause 12, wherein the second power multiplexer is disposed within a loop with a third power multiplexer, of the first type, and with a fourth power multiplexer, of the first type, the fourth power multiplexer being coupled to the first power multiplexer;
wherein the enable signal is received at the first power multiplexer through a communication path from the fourth power multiplexer; and
wherein the first power multiplexer and the third power multiplexer switch a second load from the first power supply to the second power supply.

14. The method of clause 13, wherein the first power multiplexer and the fourth power multiplexer switch a third load from the first power supply to the second power supply.

15. The method of clause 12, further comprising:
subsequent to receiving the enable signal at the first power multiplexer, sending a control signal from the first power multiplexer to a fifth power multiplexer of the first type, the control signal indicating to the fifth power multiplexer to switch a fourth load from the first power supply to the second power supply.

16. The method of clause 15, wherein the first power multiplexer and the fifth power multiplexer are arranged in a daisy chain with a controller that provides the control signal.

17. A power distribution network (PDN) on a semiconductor chip, the PDN comprising:
first means for multiplexing between a first power supply and a second power supply;
second means for multiplexing between the first power supply and the second power supply, wherein the second means is configured to receive an enable signal from the first means, the enable signal causing the second means to select between the first power supply, the second power supply, and power collapse;

wherein the first means comprises a first type of power multiplexer, and wherein the second means comprises a second type of power multiplexer different from the first type of power multiplexer, further wherein the second means comprises a plurality of power multiplexers of the second type arranged in a loop to feedback the enable signal to the first means.

18. The PDN of clause 17, further comprising:

a daisy chain of power multiplexers of the first type, including the first means, wherein the daisy chain is configured to pass a control signal among the daisy chain of power multiplexers.

19. The PDN of any of clauses 17-18, wherein the first type of power multiplexer includes a first switching logic having a lower resistance than second switching logic of the second type of power multiplexer.

20. The PDN of any of clauses 17-18, wherein each of the power multiplexers of the second type includes a respective means for generating a switching voltage.

21. The PDN of any of clauses 17-18, wherein some but not all of the power multiplexers of the second type include a respective means for generating a switching voltage, the PDN further comprising means for distributing the switching voltage among the power multiplexers of the second type.

22. The PDN of any of clauses 17-18, further comprising means for generating a switching voltage, wherein the means for generating the switching voltage are physically separate from each of the first means and the second means, the PDN further comprising means for distributing the switching voltage among the power multiplexers of the second type.

23. The PDN of any of clauses 17-18, wherein the PDN is physically arranged along opposing sides of a memory device.

24. A semiconductor chip comprising:

a first power multiplexer of a first type and a second power multiplexer of the first type, the first power multiplexer and the second power multiplexer being arranged in a daisy chain with a controller, the daisy chain passing a control signal from the controller to the first power multiplexer and on to the second power multiplexer and feeding back in the control signal to the controller;

a third power multiplexer and a fourth power multiplexer, of a second type, arranged in a first loop from the first power multiplexer, the first loop passing a first enable signal from the first power multiplexer to the third power multiplexer and the fourth power multiplexer and back to the first power multiplexer; and a fifth power multiplexer and a sixth power multiplexer, of the second type, arranged in a second loop from the second power multiplexer, the second loop passing a second enable signal from the second power multiplexer to the fifth power multiplexer and the sixth power multiplexer and back to the second power multiplexer.

25. The semiconductor chip of clause 24, wherein the first type comprises first switching logic, and wherein the second type comprises second switching logic, the first switching logic having a resistance that is higher than a resistance of the second switching logic.

26. The semiconductor chip of clause 24, wherein each one of the third power multiplexer and the fourth power multiplexer includes integrated switching voltage generating circuitry.

27. The semiconductor chip of clause 24, wherein the third power multiplexer includes integrated switching voltage generating circuitry that is not included within the fourth power multiplexer, the semiconductor chip further including voltage distribution configured to provide a switching voltage from the third power multiplexer to the fourth power multiplexer.

28. The semiconductor chip of clause 24, further comprising switching voltage generating circuitry that is physically separate from the third power multiplexer and the fourth power multiplexer, the semiconductor chip further comprising voltage distribution configured to provide a switching voltage to the third power multiplexer and the fourth power multiplexer. As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A system on chip (SOC) comprising:
   a first power multiplexer of a first type coupled to a first power supply and a second power supply, the first power multiplexer including: first switching logic disposed between the first power supply, the second power supply and a load; and
   a second power multiplexer of a second type coupled to the first power supply and the second power supply, the second power multiplexer including: second switching logic between the first power supply and the second power supply and the load, the second switching logic including an enable input coupled to the first power multiplexer.

2. The SOC of claim 1, wherein the first switching logic includes a first plurality of P-type metal oxide semiconductor (PMOS) transistors, and wherein the second switching logic includes a second plurality of PMOS transistors, further wherein the first plurality of PMOS transistors are smaller in size than the second plurality of PMOS transistors.

3. The SOC of claim 1, wherein the first switching logic includes a first plurality of P-type metal oxide semiconductor (PMOS) transistors, and wherein the second switching logic includes a second plurality of PMOS transistors, further wherein the first plurality of PMOS transistors have a collective resistance that is smaller than that of the second plurality of PMOS transistors.

4. The SOC of claim 1, further comprising:
   a third power multiplexer of the second type coupled to the first power supply and the second power supply, the third power multiplexer including: third switching logic between the first power supply and the second power supply and another load, the third switching logic including an additional enable input coupled to the first power multiplexer;
   wherein the second power multiplexer and the third power multiplexer are coupled in a loop with the first power multiplexer.

5. The SOC of claim 4, wherein the loop comprises a first path from the first power multiplexer to the enable input of the second switching logic, second path from the enable input of the second switching logic to the additional enable input, and a third path from the additional enable input to the first power multiplexer.

6. The SOC of claim 4, wherein the second power multiplexer includes a first voltage generator configured to provide a switching voltage to the second switching logic, further wherein the third power multiplexer includes a second voltage generator configured to provide the switching voltage to the third switching logic.

7. The SOC of claim 4, wherein the second power multiplexer includes a first voltage generator configured to provide a switching voltage to the second switching logic and to the third switching logic.

8. The SOC of claim 4, further comprising a first voltage generator physically separate from the first power multiplexer and from the second power multiplexer, the first voltage generator being configured to provide a switching voltage to the second switching logic and to the third switching logic.

9. The SOC of claim 1, further comprising:
a fourth power multiplexer of the second type coupled to the first power supply and the second power supply, the fourth power multiplexer including: fourth switching logic between the first power supply and the second power supply and another load, the fourth switching logic including an additional enable input coupled to the first power multiplexer; and
a control circuit coupled to a plurality of voltage generators associated with each of the first power multiplexer, the second power multiplexer, and the fourth power multiplexer.

10. The SOC of claim 9, wherein the control circuit includes a comparator coupled to the first power supply and to the second power supply, wherein an output of the comparator is coupled to the plurality of voltage generators.

11. The SOC of claim 1, further comprising:
a fifth power multiplexer of the second type coupled to the first power supply and the second power supply, the fifth power multiplexer including: fifth switching logic between the first power supply and the second power supply and another load, the fifth switching logic including an additional enable input coupled to the first power multiplexer; and
a plurality of memory bit cells arranged in a plurality of rows and a plurality of columns;
wherein the first power multiplexer, the second power multiplexer, and the fifth power multiplexer are arranged in a column parallel to a first column of the plurality of columns;
wherein the second power multiplexer includes a first voltage generator configured to provide a switching voltage to the second switching logic, to the fifth switching logic.

12. A method comprising:
sending an enable signal from a first power multiplexer of a first type to a second power multiplexer of a second type;
switching a first load from a first power supply to a second power supply by the first power multiplexer and the second power multiplexer, the second power multiplexer switching the first load in response to the enable signal; and
receiving the enable signal at the first power multiplexer.

13. The method of claim 12, wherein the second power multiplexer is disposed within a loop with a third power multiplexer, of the first type, and with a fourth power multiplexer, of the first type, the fourth power multiplexer being coupled to the first power multiplexer;
wherein the enable signal is received at the first power multiplexer through a communication path from the fourth power multiplexer; and
wherein the first power multiplexer and the third power multiplexer switch a second load from the first power supply to the second power supply.

14. The method of claim 13, wherein the first power multiplexer and the fourth power multiplexer switch a third load from the first power supply to the second power supply.

15. The method of claim 12, further comprising:
subsequent to receiving the enable signal at the first power multiplexer, sending a control signal from the first power multiplexer to a fifth power multiplexer of the first type, the control signal indicating to the fifth power multiplexer to switch a fourth load from the first power supply to the second power supply.

16. The method of claim 15, wherein the first power multiplexer and the fifth power multiplexer are arranged in a daisy chain with a controller that provides the control signal.

17. A power distribution network (PDN) on a semiconductor chip, the PDN comprising:
first means for multiplexing between a first power supply and a second power supply; and
second means for multiplexing between the first power supply and the second power supply, wherein the second means is configured to receive an enable signal from the first means, the enable signal causing the second means to select between the first power supply, the second power supply, and power collapse;
wherein the first means comprises a first type of power multiplexer, and wherein the second means comprises a second type of power multiplexer different from the first type of power multiplexer, further wherein the second means comprises a plurality of power multiplexers of the second type arranged in a loop to feedback the enable signal to the first means.

18. The PDN of claim 17, further comprising:
a daisy chain of power multiplexers of the first type, including the first means, wherein the daisy chain is configured to pass a control signal among the daisy chain of power multiplexers.

19. The PDN of claim 17, wherein the first type of power multiplexer includes a first switching logic having a lower resistance than second switching logic of the second type of power multiplexer.

20. The PDN of claim 17, wherein each of the power multiplexers of the second type includes a respective means for generating a switching voltage.

21. The PDN of claim 17, wherein some but not all of the power multiplexers of the second type include a respective means for generating a switching voltage, the PDN further comprising means for distributing the switching voltage among the power multiplexers of the second type.

22. The PDN of claim 17, further comprising means for generating a switching voltage, wherein the means for generating the switching voltage are physically separate from each of the first means and the second means, the PDN further comprising means for distributing the switching voltage among the power multiplexers of the second type.

23. The PDN of claim 17, wherein the PDN is physically arranged along opposing sides of a memory device.

24. A semiconductor chip comprising:
a first power multiplexer of a first type and a second power multiplexer of the first type, the first power multiplexer and the second power multiplexer being arranged in a daisy chain with a controller, the daisy chain passing a control signal from the controller to the first power multiplexer and on to the second power multiplexer and feeding back in the control signal to the controller;

a third power multiplexer and a fourth power multiplexer, of a second type, arranged in a first loop from the first power multiplexer, the first loop passing a first enable signal from the first power multiplexer to the third power multiplexer and the fourth power multiplexer and back to the first power multiplexer; and a fifth power multiplexer and a sixth power multiplexer, of the second type, arranged in a second loop from the second power multiplexer, the second loop passing a second enable signal from the second power multiplexer to the fifth power multiplexer and the sixth power multiplexer and back to the second power multiplexer.

25. The semiconductor chip of claim 24, wherein the first type comprises first switching logic, and wherein the second type comprises second switching logic, the first switching logic having a resistance that is higher than a resistance of the second switching logic.

26. The semiconductor chip of claim 24, wherein each one of the third power multiplexer and the fourth power multiplexer includes integrated switching voltage generating circuitry.

27. The semiconductor chip of claim 24, wherein the third power multiplexer includes integrated switching voltage generating circuitry that is not included within the fourth power multiplexer, the semiconductor chip further including voltage distribution configured to provide a switching voltage from the third power multiplexer to the fourth power multiplexer.

28. The semiconductor chip of claim 24, further comprising switching voltage generating circuitry that is physically separate from the third power multiplexer and the fourth power multiplexer, the semiconductor chip further comprising voltage distribution configured to provide a switching voltage to the third power multiplexer and the fourth power multiplexer.

* * * * *